United States Patent
Vaughan

(10) Patent No.: US 6,850,546 B2
(45) Date of Patent: Feb. 1, 2005

(54) DRIVER CIRCUIT

(75) Inventor: Barry John Vaughan, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/164,556

(22) Filed: Jun. 10, 2002

(65) Prior Publication Data

US 2002/0186733 A1 Dec. 12, 2002

(30) Foreign Application Priority Data

Jun. 8, 2001 (EP) .............................................. 01305015

(51) Int. Cl.$^7$ ................................................ H01S 3/00
(52) U.S. Cl. .................. 372/38.02; 372/38.01
(58) Field of Search ........................... 372/38.1–38.04, 372/38.07

(56) References Cited

U.S. PATENT DOCUMENTS

| | | | | |
|---|---|---|---|---|
| 4,282,495 A | * | 8/1981 | Ljung | 372/38.02 |
| 5,224,111 A | * | 6/1993 | Stilwell et al. | 398/5 |
| 5,347,388 A | * | 9/1994 | Little et al. | 398/202 |
| 5,477,370 A | * | 12/1995 | Little et al. | 398/202 |
| 5,661,739 A | * | 8/1997 | Ohashi | 372/29.011 |
| 5,872,474 A | * | 2/1999 | Kagomiya et al. | 327/130 |
| 5,883,910 A | * | 3/1999 | Link | 372/38.07 |
| 5,886,578 A | * | 3/1999 | Miyashita et al. | 330/253 |
| 5,966,159 A | * | 10/1999 | Ogasawara | 347/133 |
| 5,974,064 A | * | 10/1999 | Uchida | 372/38.02 |
| 5,991,059 A | * | 11/1999 | Severn | 359/152 |
| 5,991,320 A | * | 11/1999 | Nakayama | 372/38.02 |
| 6,021,143 A | * | 2/2000 | Ransijn et al. | 372/38.02 |
| 6,021,144 A | * | 2/2000 | Meyer et al. | 372/38.02 |
| 6,069,523 A | | 5/2000 | Brown | |
| 6,285,692 B1 | * | 9/2001 | Okayasu | 372/38.02 |
| 6,404,293 B1 | * | 6/2002 | Darabi et al. | 331/37 |
| 6,441,689 B1 | * | 8/2002 | Joseph | 330/302 |
| 2002/0190791 A1 | * | 12/2002 | Serbe et al. | 330/124 R |

FOREIGN PATENT DOCUMENTS

| | | |
|---|---|---|
| EP | 0 756 362 A1 | 1/1997 |
| GB | 2 005 101 A | 4/1979 |
| WO | 00 64045 A | 10/2000 |

OTHER PUBLICATIONS

Publication No. XP–002184235, "Frequenzgang–Korrektur" pp. 115–125.
Patent Abstract of Japan Publication No. 02090709.
Patent Abstract of Japan Publication No. 01036219.

* cited by examiner

Primary Examiner—Minsun Oh Harvey
Assistant Examiner—Phillip Nguyen

(57) ABSTRACT

A driver circuit has a laser diode coupled in series between a supply voltage and a driving transistor collector electrode. The diode and transistor respectively have low input and high output impedances. Resonances are caused by the impedance mismatch and reactive components of the diode and transistor impedances. Feedback between the laser diode input and the transistor control electrode minimizes the effects of the resonances.

14 Claims, 5 Drawing Sheets

DRIVER CIRCUIT

FIELD OF THE INVENTION

The invention relates, in general, to driver circuits and more particularly to laser driver circuits, such as those used in telecommunications applications, especially, for high speed optical communications.

BACKGROUND OF THE INVENTION

A laser driver circuit is used for modulating the light output of a laser diode at high frequencies in accordance with data applied to the driver circuit. The laser driver circuit is usually based on a balanced differential pair with a differential data input being applied to the differential pair.

However, various features associated with laser driver circuits lead to resonances which are problematic. For example, the impedance mismatch between the laser driver output and a laser, especially coupled with reactive elements between them, can cause resonances. Resonances modify signals within a circuit, and may distort the output signal of the laser.

In order to attempt to overcome the resonance problems, several methods are employed by prior art devices. For example, it is known to use resistors in series to attempt to dampen the resonances, but passive resistive components are lossy and often cannot be used due to limited voltage headroom in the laser driver circuit. Alternatively, it is known to use reactive components or tuning stubs to match input and output impedances and reduce the resonances, but the reactive components or tuning stubs must be of a very high quality, which increases the cost of manufacture, and finely tuned, which limits the range of operating frequencies.

Therefore, it is desirable to remove, or at least reduce, resonances in a driver circuit without adversely affecting the output of the driver circuit.

BRIEF SUMMARY OF THE INVENTION

Accordingly, a first aspect of the present invention provides a driver circuit comprising a first transistor having a first current electrode coupled to a current source, a second current electrode and a control electrode coupled to a first input terminal, a low impedance load having a first terminal coupled to the second current electrode of the first transistor and a second terminal coupled to a supply rail, and an impedance element coupled to the control electrode of the first transistor to provide AC feedback thereto.

Preferably, the first transistor forms part of a differential pair in which a second transistor has a first current electrode coupled to the current source, a second current electrode coupled to a resistive element and a control electrode coupled to a second input terminal, the first and second input terminals being differential inputs for receiving differential data signals.

The impedance element preferably has a first terminal coupled to the control electrode of the first transistor and a second terminal coupled to the second current electrode of one of the first or second transistors. In a preferred embodiment, the driver circuit further comprises a second impedance element having a first terminal coupled to the control electrode of the second transistor and a second terminal coupled to the second current electrode of the second transistor.

In one embodiment, the impedance element comprises a differential amplifier having an input coupled to the second current electrode of one of the first or second transistors and a first and second differential outputs, the first differential output being coupled to the control electrode of the first transistor and the second differential output being coupled to the control electrode of the second transistor.

Alternatively, the impedance element comprises a resistive element and a capacitive element coupled in series between the second current electrode of the first transistor and the control electrode of the first transistor.

The impedance element can include an inductive element.

Preferably, the low impedance load is a laser diode.

According to a second aspect of the present invention, there is provided a method of mitigating for the effects of resonances in a driver circuit having a high impedance source and a low impedance load, the method comprising coupling an impedance feedback path between an input to the low impedance load and an input to the high impedance source.

Preferably, the low impedance load is a laser diode.

The high impedance source is preferably a first transistor forming part of a differential pair.

In a preferred embodiment, the impedance feedback path is a resistive element and a capacitive element coupled in series.

The values of the resistive element and the capacitive element can be chosen so as to provide a low pass filtering effect having a cut-off frequency less than a lowest frequency of any substantial resonances present.

Alternatively, the values of the resistive element and the capacitive element can be chosen so as to provide a filtering effect reducing output power including any resonances present but maintaining a high bandwidth.

BRIEF DESCRIPTION OF THE DRAWINGS

Exemplary embodiments of the present invention will now be described with reference to the accompanying drawings, of which.

DETAILED DESCRIPTION OF THE DRAWINGS

Figure 1:
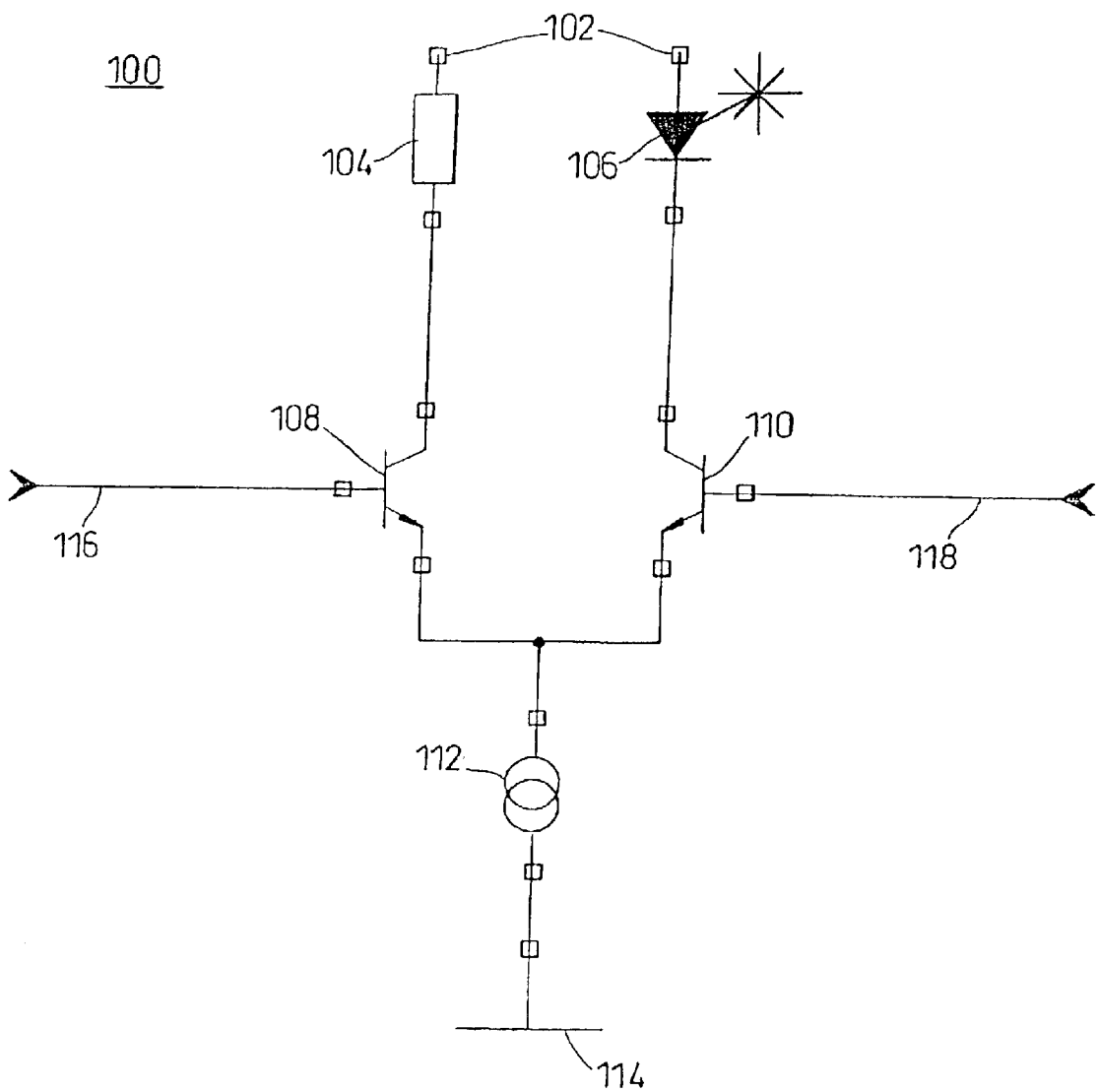
FIG. 1 is a circuit diagram of a prior art laser driver circuit.

Thus, FIG. 1 shows a known laser driver circuit 100, essentially having a differential pair configuration. A resistor 104 is coupled to a positive supply voltage rail 102. Also coupled to the supply voltage rail 102 is a laser diode 106. The resistor 104 is connected in series with a collector electrode of a first transistor 108. An emitter electrode of the first transistor 108 is coupled to a current source 112. In a symmetrical manner, an emitter electrode of a second transistor 110 is coupled to the current source 112. A first signal input lead 116 is coupled to a base electrode of the first transistor 108 and a second signal input lead 118 is coupled to a base electrode of the second transistor 110.

In operation, a high frequency input data signal is applied to the second signal input lead 118 and an inverse input data signal is applied to the first signal input lead 116. The first transistor 108 and the second transistor 110 are matched. Furthermore, the resistor 104 functions as a means of power dissipation and approximate load matching. Generally, an impedance mismatch occurs because the sources of the laser driver circuit 100 are first transistor 108 and second transistor 110 of approximate resistance 1 kΩ, whereas the loads of the circuit are laser diode 106 having equivalent AC resistance of approximately 5Ω and resistor 104 having resistance of typically 30Ω.

Figure 2:
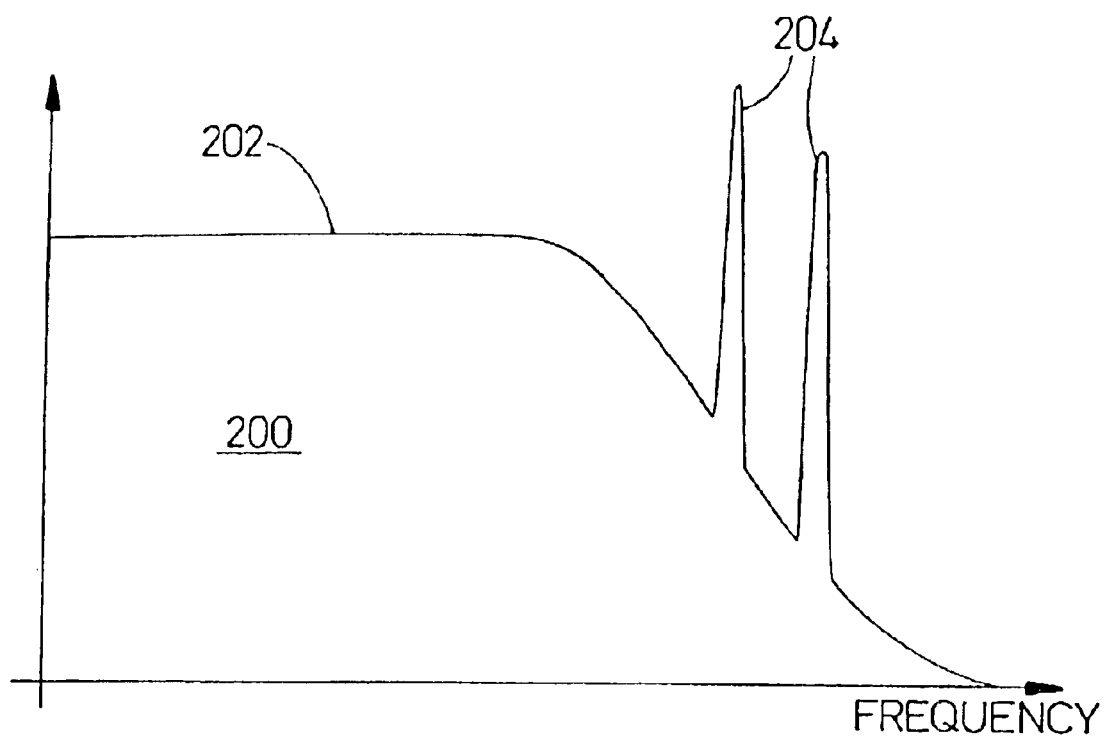
FIG. 2 shows an example frequency response of the prior art laser driver circuit of FIG. 1.

An exemplary frequency response curve for the laser driver circuit 100 of FIG. 1 is illustrated in FIG. 2. At relatively low frequencies the output response 200 maintains a constant value 202 with respect to the input frequency. At high frequencies, resonances 204 are evident which would have a substantial effect on an output signal.

Figure 3:
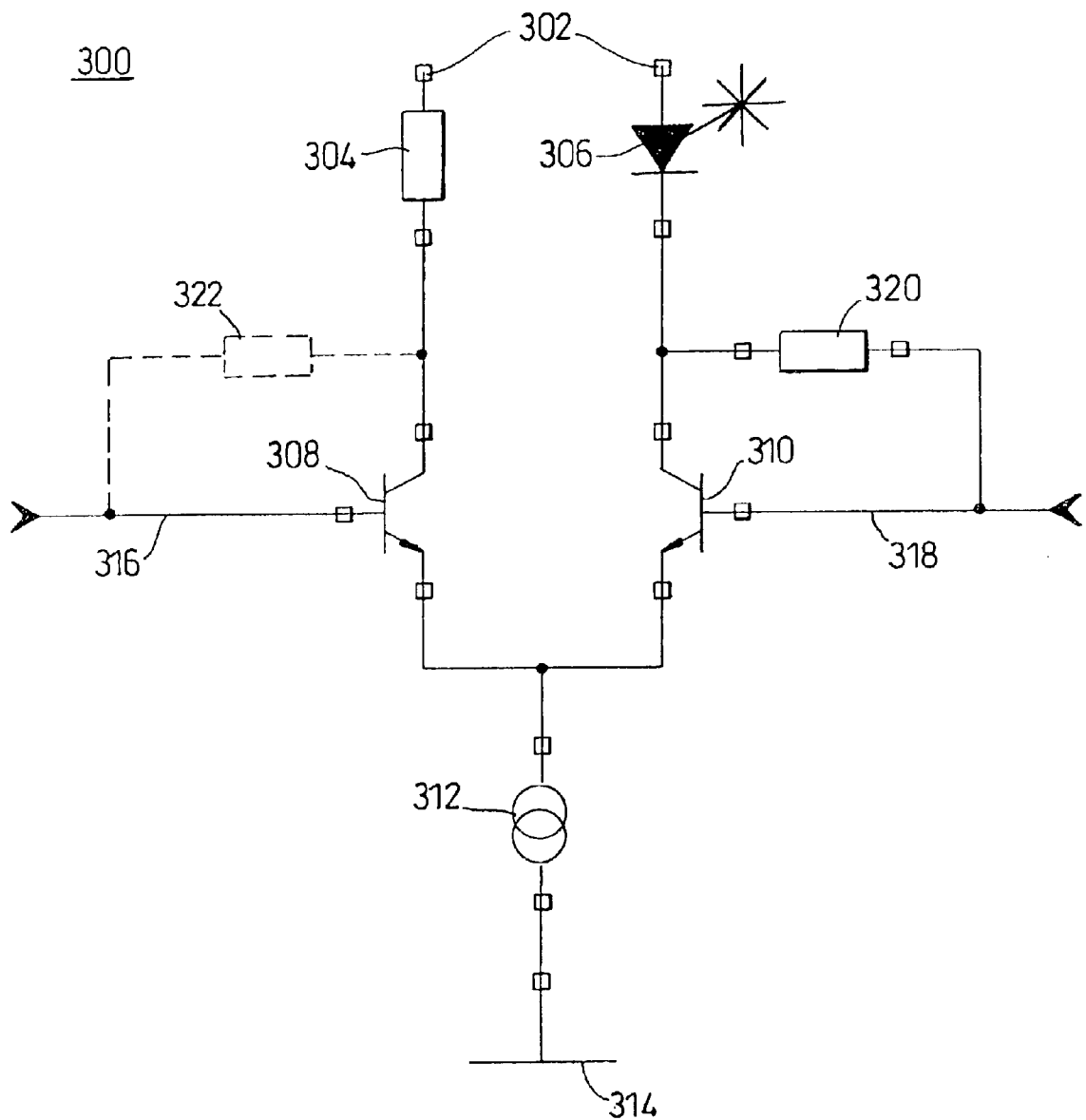
FIG. 3 is a circuit diagram of a laser driver circuit constituting a first embodiment of the present invention.

A circuit diagram of a first embodiment of the present invention is illustrated in FIG. 3. In this case, the structure of the circuit diagram 300 is the same as that of the circuit diagram shown in FIG. 1, with identical features to those of FIG. 1 having the same reference numerals as those of FIG. 1, but with the prefix "3" instead of the prefix "1". Thus, for example, resistor 104 in FIG. 1 is resistor 304 in FIG. 3. In circuit diagram 300 a feedback impedance 320 is coupled between the collector electrode of the second transistor 310 and the second signal input lead 318. The feedback impedance 320 generally comprises a resistor and a capacitor.

In operation, the addition of the feedback impedance 320 acts to feed back the reflected signals from the laser diode 306 and transistor 310 into the second signal input lead 318. The magnitude of the resistor and the capacitor within feedback impedance 320 affect the frequency response of the circuit. Thus, the feedback impedance 320 can mitigate the resonances.

Figure 4:
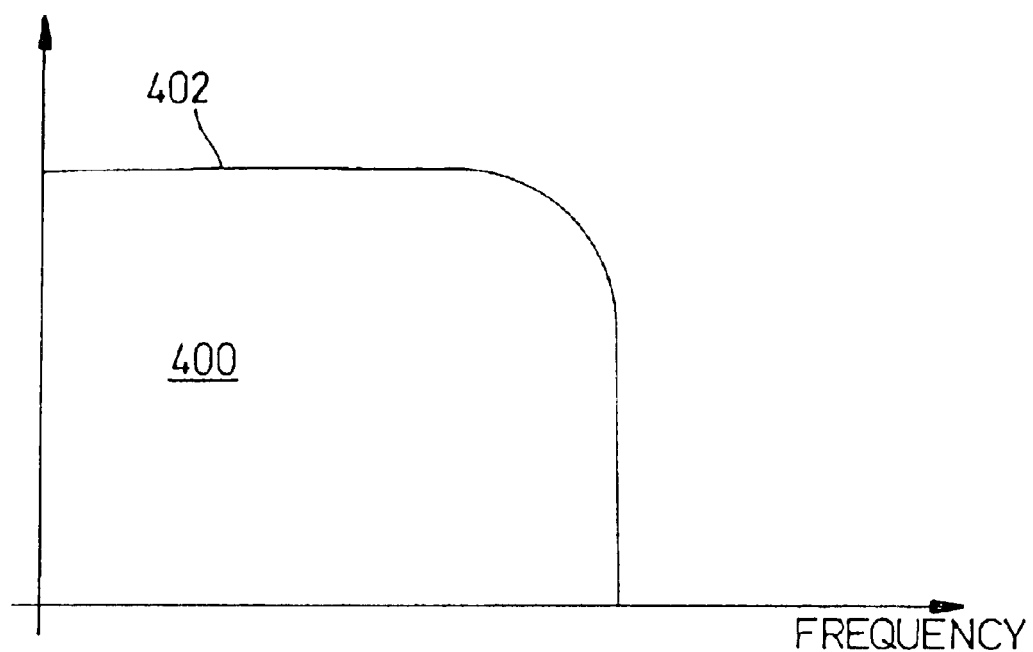
FIG. 4 shows an example frequency response of the laser driver circuit of FIG. 3 with one set of component values.

Furthermore, in circuit diagram 300 an optional feedback impedance 322 (indicated by a dotted line in FIG. 3) is coupled between the collector electrode of the first transistor 308 and the first signal input lead 316. The optional feedback impedance 322, generally comprising a resistor and a capacitor, assists in maintaining the laser driver circuit 300 in a balanced state. An example frequency response curve of the laser driver circuit 300 of FIG. 3 is illustrated in FIG. 4 and in FIG. 5. The frequency response curve 400 of FIG. 4 results when the resistor and the capacitor of the feedback impedance 320 have relatively low values (for example 600Ω and 5 pF, respectively). In this case, the resistor and capacitor serve to provide a low pass filter with a cut-off frequency determined to be just lower than the resonance frequency. At lower frequencies the output 400 maintains a constant value 402. The output 400 is however cut-off before the very high frequency range (and associated resonances) are reached. Thus, although the bandwidth is reduced, the output power is maintained at lower frequencies.

Figure 5:
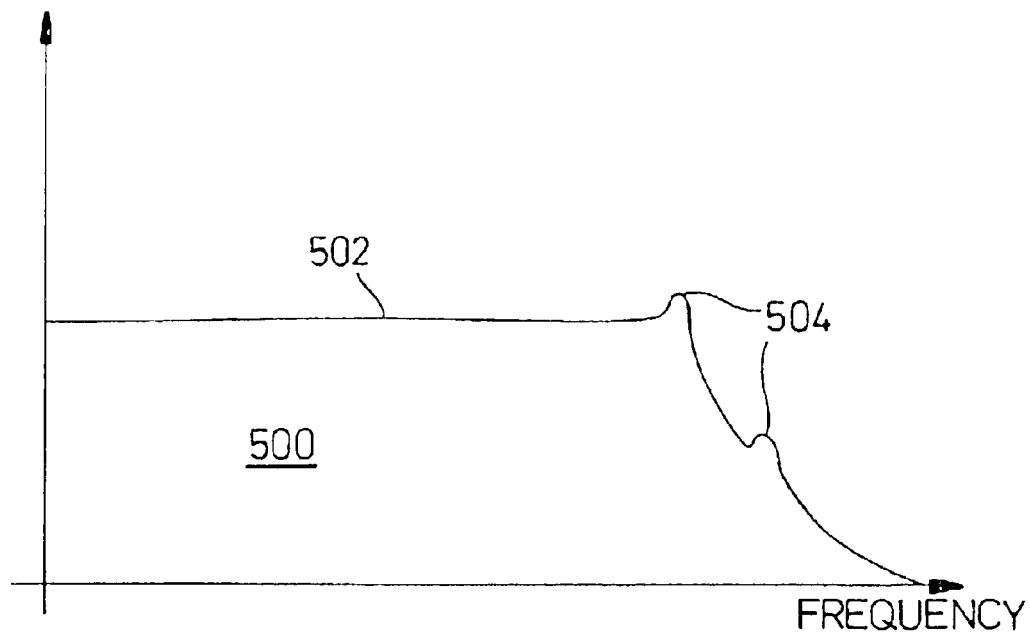
FIG. 5 shows an example frequency response of the laser driver circuit of FIG. 3 with a second set of component values.

The frequency response curve 500 of FIG. 5 results when the resistor and the capacitor of the feedback impedance 320 have relatively high values (for example 2 kΩ and 20 pF, respectively). Again, at lower frequencies the output 500 maintains a constant value 502. However, the output power is somewhat reduced at lower frequencies due to the effect of the feedback impedance. This filtering effect also causes the resonances to be substantially reduced, as shown at resonance peaks 504.

Ideally, the feedback impedance would have a very high value capacitor and a low value resistor to provide essentially DC blocking with a flat frequency response. However, the realisation of a very high value capacitor within an integrated circuit causes manufacturing difficulties.

Figure 6:
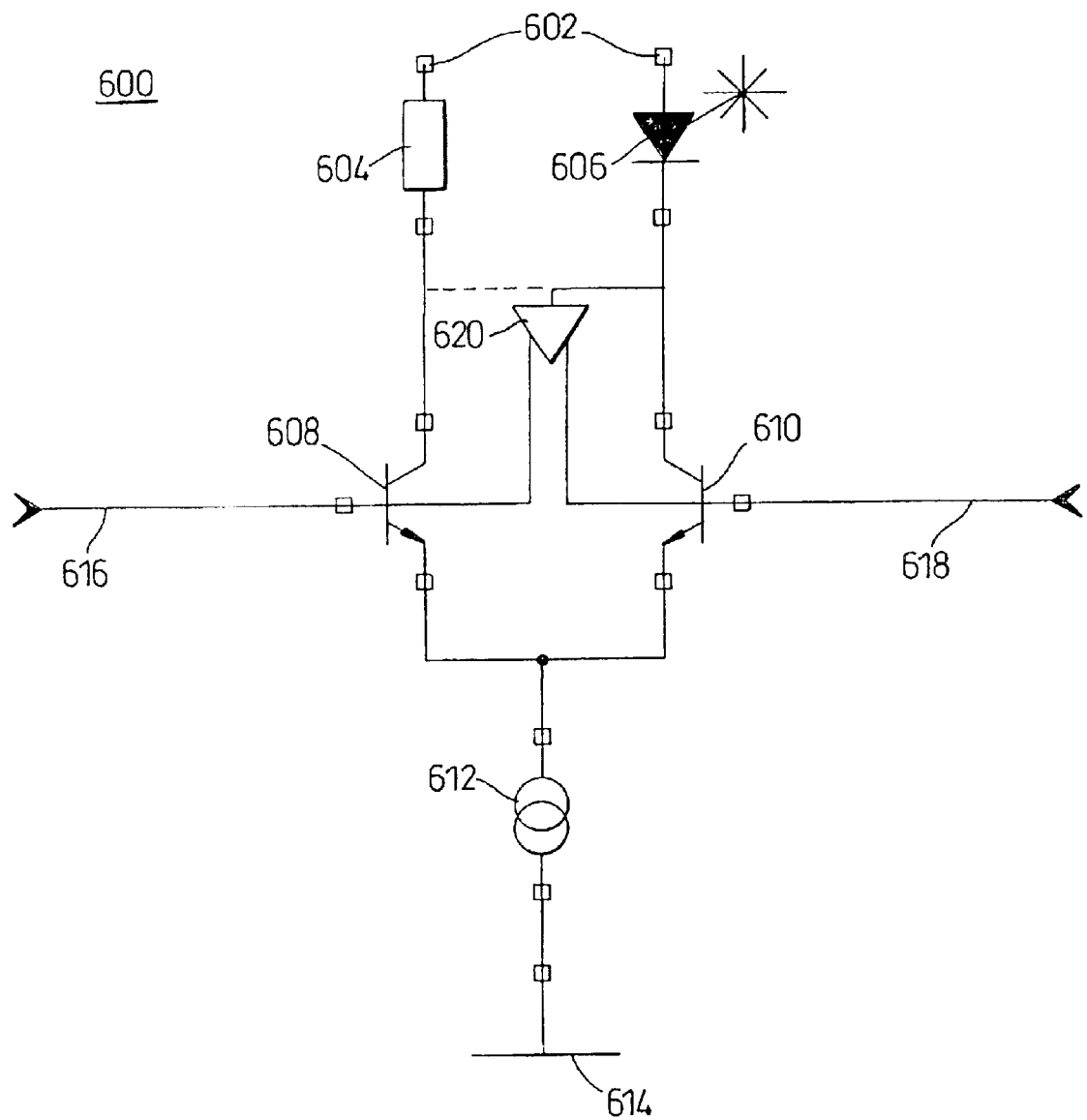
FIG. 6 is a circuit diagram of a laser driver circuit constituting a second embodiment of the present invention.

A circuit diagram of a second embodiment of the present invention is illustrated in FIG. 6. In this case, the structure of the circuit diagram 600 is the same as that of the circuit diagram shown in FIG. 1, with identical features to those of FIG. 1 having the same reference numerals as those of FIG. 1, but with the prefix "6" instead of the prefix "1". Thus, for example, resistor 104 in FIG. 1 is resistor 604 in FIG. 6. In circuit diagram 600 a differential amplifier 620 is coupled between the collector electrode of the second transistor 610 and the base electrode of both the first transistor 608 and the second transistor 610.

In operation, the addition of the differential amplifier 620 acts to feed back the output driving signal from transistor 610 into the first and second signal input leads 616, 618, and has a similar effect to the feedback impedance 320 in FIG. 3.

In operation, the alternative implementation has the same effect as the first implementation described.

Advantageously, the present invention provides a system which minimises or removes resonances in a driver circuit Also, the invention is simple to implement and relatively cheap to realise.

The present invention is generally applicable to differential amplifiers and is particularly applicable to laser driver devices.

Whilst the invention has been described above in respect of several particular embodiments and implementations of a laser driver circuit, it will be appreciated that the present invention is applicable to any differential pair suffering, or potentially suffering, from resonance effects. Furthermore, it will be appreciated that the above description has been given by way of example only and that a person skilled in the art can make modifications and improvements without departing from the scope of the present invention. For example, it should be apparent that the feedback impedance could include an inductance, which would provide a tuned filtering effect to remove just the resonance frequencies. However, it is difficult to realise inductors on a chip.

What is claimed is:

1. A circuit adapted to be responsive to an AC input signal and a DC power supply voltage comprising a transistor having a control electrode adapted to be connected to the AC input signal and a variable impedance between first and second electrodes controlled by the value of the AC input signal, a laser diode connected between a DC power supply terminal adapted to be connected to the DC power supply voltage and the second electrode, the second electrode having a relatively high output impedance and a reactive component at a frequency of the AC input signal, the diode having an electrode with a relatively low input impedance coupled to the second electrode and a reactive component at the frequency of the AC input, resonances being caused by the differences in the high output impedance and low input impedance and the reactive impedances, and a negative feedback arrangement between the second electrode and control electrode for minimizing the effects of the resonances, the feedback arrangement including an amplifier for reversing the polarity of the voltages at the second electrode as coupled to the control electrode.

2. The circuit of claim 1 wherein the feedback arrangement includes a resistive element and a capacitive element coupled in series.

3. A circuit adapted to be responsive to an AC input signal and a DC power supply voltage comprising a transistor having a control electrode adapted to be connected to the AC input signal and a variable impedance between first and second electrodes controlled by the value of the AC input signal, a laser diode connected between a DC power supply terminal adapted to be connected to the DC power supply voltage and the second electrode, the second electrode having a relatively high output impedance and a reactive component at a frequency of the AC input signal, the diode having an electrode with a relatively low input impedance coupled to the second electrode and a reactive component at the frequency of the AC input, resonances being caused by the differences in the high output impedance and low input impedance and the reactive impedances, and a negative feedback arrangement between the second electrode and control electrode for minimizing the effects of the resonances, the transistor being a first transistor of a differential amplifier, the AC input signal being a first AC input to the control electrode of the first transistor, the differential amplifier having a second transistor substantially watched with the first transistor and having a second control electrode adapted to be connected to a second AC input signal that is complementary to the first AC input signal, the second transistor having a variable impedance between third and fourth electrodes controlled by the value of the second AC input signal, an element having an impedance connected between the DC power supply terminal and the fourth electrode, the first and third electrodes being connected together.

4. The circuit of claim 3 wherein the feedback arrangement includes a resistive element and a capacitive element coupled in series.

5. The circuit of claim 3 wherein the negative feedback arrangement includes an amplifier for (a) reversing the polarity of the voltage at the second electrode as coupled to the control electrode of the first transistor and (b) applying to the control electrode of the second transistor a voltage that is complementary to the voltage it applies to the control electrode of the first transistor.

6. The circuit of claim 3 wherein the feedback arrangement includes a resistive element and a capacitive element coupled in series.

7. A driver circuit comprising a first transistor having a first current electrode coupled to a current source, a second current electrode coupled to a first terminal of a low impedance load, the low impedance load having a second terminal coupled to a non-grounded supply rail, the first transistor further comprising a control electrode coupled to a first input terminal, wherein the driver circuit further comprises an impedance element coupled between the second current electrode and the control electrode to provide AC feedback thereto, the first transistor forming part of a differential pair in which a second transistor has a first current electrode coupled to the current source, a second current electrode coupled to a first terminal of a resistive element, the resistive element having a second terminal coupled to the supply rail, the second transistor further comprising a control electrode coupled to a second input terminal, the first and second input terminals being differential inputs for receiving differential data signals.

8. A driver circuit according to claim 7, further comprising a second impedance element coupled between the second current electrode of the second transistor and the control electrode of the second transistor.

9. A driver circuit comprising:
a first transistor having a first current electrode coupled to a current source, a second current electrode coupled to a first terminal of a low impedance load, the low impedance load having a second terminal coupled to a supply rail, the first transistor further comprising a control electrode coupled to a first input terminal,
a second transistor having a first current electrode coupled to the current source, a second current electrode coupled to a first terminal of a resistive element, the resistive element having a second terminal coupled to the supply rail, the second transistor further comprising a control electrode coupled to a second input terminal,
wherein the first and second transistors form a differential pair of transistors and the first and second input terminals are differential inputs for receiving differential data signals; and
wherein the driver circuit further comprises an impedance element coupled between the second current electrode of the second transistor and the control electrode of the second transistor to provide AC feedback thereto.

10. The driver circuit according to claim 9 wherein the load impedance load includes a laser semiconductor diode.

11. A driver circuit comprising:
a first transistor having a first current electrode coupled to a current source, a second current electrode coupled to a first terminal of a low impedance load, the low impedance load having a second terminal coupled to a supply rail, the first transistor further comprising a control electrode coupled to a first input terminal,
a second transistor having a first current electrode coupled to the current source, a second current electrode coupled to a first terminal of a resistive element, the resistive element having a second terminal coupled to the supply rail, the second transistor further comprising a control electrode coupled to a second input terminal,
wherein the first and second transistors form a differential pair of transistors and the first and second input terminals are differential inputs for receiving differential data signals, and
wherein the driver circuit further comprises a first impedance element coupled between the second current electrode of the first transistor and the control electrode of the first transistor to provide AC feedback thereto, and a second impedance element coupled between the second current electrode of the second transistor and the control electrode of the second transistor to provide AC feedback thereto.

12. The driver circuit according to claim 11 wherein the load impedance load includes a laser semiconductor diode.

13. A driver circuit comprising:
a first transistor having a first current electrode coupled to a current source, a second current electrode coupled to a first terminal of a low impedance load, the low impedance load having a second terminal coupled to a supply rail, the first transistor further comprising a control electrode coupled to a first input terminal,
a second transistor having a first current electrode coupled to the current source, a second current electrode coupled to a first terminal of a resistive element, the resistive element having a second terminal coupled to the supply rail, the second transistor further, comprising a control electrode coupled to a second input terminal,
wherein the first and second transistors form a differential pair of transistors and the first and second input terminals are differential inputs for receiving differential data signals, and
wherein the driver circuit further comprises a differential amplifier having an input coupled to the second current electrode of the first transistor and first and second differential outputs, the first differential output being coupled to the control electrode of the first transistor and the second differential output being coupled to the control electrode of the second transistor.

14. The driver circuit according to claim 13 wherein the load impedance load includes a laser semiconductor diode.

* * * * *